(12) United States Patent
Lin

(10) Patent No.: US 6,348,287 B1
(45) Date of Patent: Feb. 19, 2002

(54) MULTIPHASE PHASE SHIFTING MASK

(75) Inventor: Benjamin Szu-Min Lin, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/495,247

(22) Filed: Jan. 31, 2000

(51) Int. Cl.⁷ .............................................. G03F 9/00
(52) U.S. Cl. ............................................... 430/5
(58) Field of Search ........................... 430/5, 322, 394; 716/21

(56) References Cited

U.S. PATENT DOCUMENTS 6,114,095 A * 9/2000 Nakabayashi et al. .......... 430/5

* cited by examiner

Primary Examiner—S. Rosasco

(57) ABSTRACT

A multiphase phase shifting mask is described. The multiphase phase shifting mask comprises a transparent substrate; a lightly transparent material shifting an exposure light by about 180° in phase on the transparent substrate, a first group of transparent hole features shifting the exposure light by about 90° in phase on the transparent substrate, a second group of transparent hole features shifting the exposure light by about 270° in phase on the transparent substrate, and at least one transparent hole feature shifting the exposure light by about 0° in phase on the transparent substrate. The first and the second groups of transparent hole features are alternatively arranged with each other. The transparent hole feature shifting the exposure light by about 0° in phase is spaced apart from but substantially surrounded by the first and the second groups of transparent hole features. Each of the hole features shifting the exposure light by about 90° in phase, the hole features shifting the exposure light by about 270° in phase, and the hole feature shifting the exposure light by about 0° in phase is adjacently surrounded by the lightly transparent material shifting the exposure light by about 180° in phase.

14 Claims, 3 Drawing Sheets

MULTIPHASE PHASE SHIFTING MASK

BACKGROUND OF THE INVENTION

1. Technical Field

The present invention relates to lithography, and particularly to a phase shifting mask.

2. Description of Related Art

In semiconductor fabrication, lithography is an important and indispensable technique which is used to transfer circuit layout patterns through a mask onto predefined locations on a semiconductor wafer. Many processes of semiconductor fabrication, such as etching and ion implantation, require the use of lithography. In a lithographic process, resolution and depth of focus (DOF) are two major checkpoints used to appraise the quality of the pattern definition. A high level of integration requires a high resolution of pattern definition since the feature size is very small. To increase the resolution, a laser source with a very short wavelength, such as a krypton (Kr) deep ultra-violet laser with a wavelength of 2,480 Å (angstrom), is used as the exposure light in the lithographic process. The use of a short-wavelength exposure light, however, will result in a shallow DOF. To allow high resolution and good DOF, one solution is to use the so-called phase shifting mask (PSM).

Multiphase phase shifting mask shifting an exposure light by about 90° or 270° in phase is phase shifting mask used to improve resolution of hole patterns with low duty ratio. However, proximity effect could be worse due to isolated/dense surrounding difference. Specifically, the assist hole features, shifting the exposure light by about 90° or 270° in phase and surrounding the hole feature of a multiphase phase shift mask, cause environment phase differences that deteriorate the resolution of hole patterns with low duty ratio. For the foregoing reasons, there is a need for a multiphase phase shifting mask that can prevent the isolated/dense proximity issues caused by environment phase differences.

SUMMARY OF THE INVENTION

It is an object of this invention to provide a multiphase phase shifting mask that satisfies the need identified in the background section.

Other objects and advantages of this invention will become apparent to those of ordinary skill in the art having reference to the following specification in conjunction the drawings.

The present invention is directed to a phase shifting mask. The phase shifting mask comprises a transparent substrate; a lightly transparent material shifting an exposure light by about 180° in phase on the transparent substrate; and a plurality of first transparent hole features and second transparent hole features phase shifting the exposure light by about 0° in phase on the transparent substrate. The phase shifting mask further comprises a plurality of assist transparent hole features alternatively located between the second transparent hole features.

The assist transparent hole features comprises a first group of transparent hole features shifting the exposure light by about 90° in phase and a second group of transparent hole features shifting the exposure light by about 270° in phase alternatively arranged with each other. Each of the first, the second, and the assist transparent hole features is adjacently surrounded by the lightly transparent material.

In a preferred embodiment of the present invention, the lightly transparent material, which is MoSiOxNy or MoSi, has a transmittance of about 6%.

By the lightly transparent material, the present invention can increase the image contrast to prevent the isolated/dense proximity issues caused by environment phase differences.

BRIEF DESCRIPTION OF THE DRAWINGS

The foregoing versions and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1:
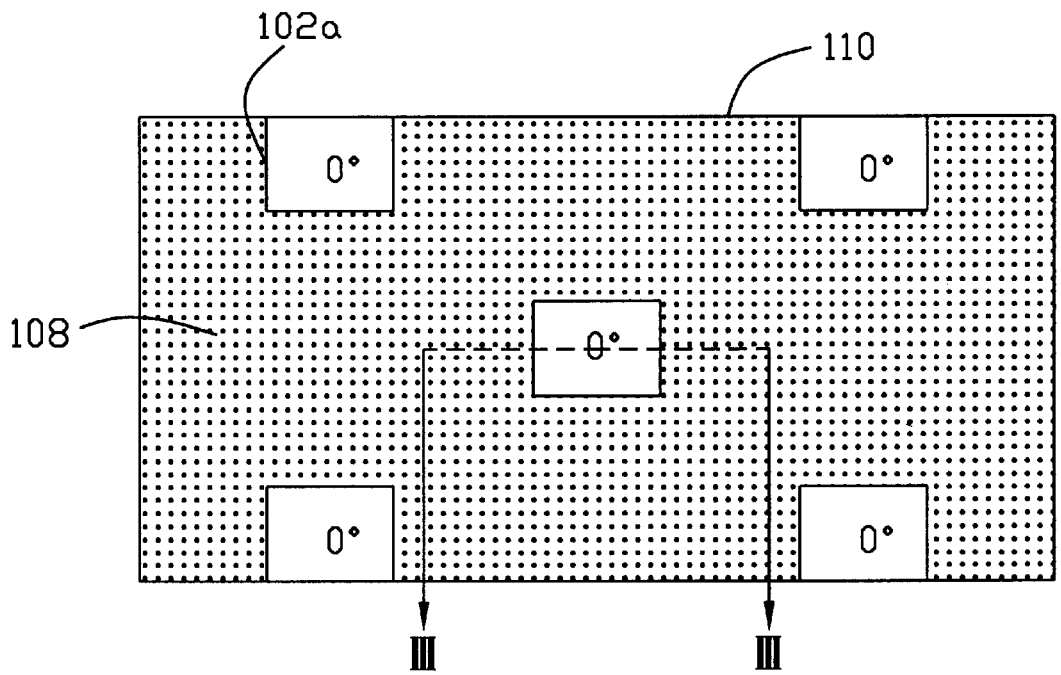
FIG. 1 and FIG. 2 are top-view diagrams of portions of a phase shifting mask, according to the preferred embodiment (s) of the invention.
Figure 2:
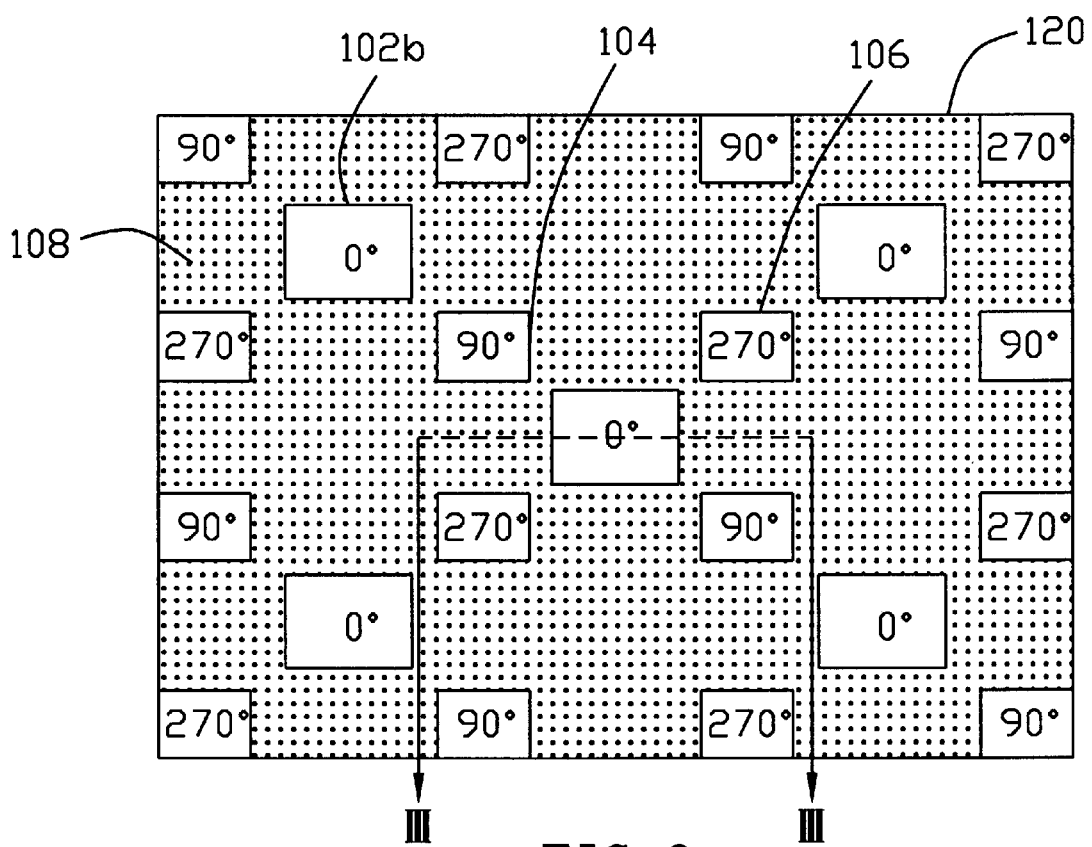

Referring to FIG. 1 and FIG. 2, a phase shifting mask having an isolated region 110 and a dense region 120 is described. In one version of the present invention, the multiphase phase shifting mask comprises a lightly transparent material 108, a plurality of first transparent hole features 102a (in the isolated region 110), a plurality of second transparent hole features 102b (in the dense region 120), and a plurality of assist transparent hole features 104, 106.

The lightly transparent material 108 preferably has a transmittance of about 6% and preferably can shift an exposure light by about 180° in phase. The lightly transparent material 108 can be MoSiOxNy, MoSi, or both, or any other half tone phase shifting material.

The first transparent hole features 102a can shift the exposure light by about 0° in phase (i.e., they do not shift the exposure). Each first transparent hole feature 102a is adjacently surrounded by the lightly transparent material 108. The second transparent hole features 102b also shift the exposure light by about 0° in phase (i.e., they do not shift the exposure). Each second transparent hole feature 102b is also adjacently surrounded by the material 108. However, between the second transparent hole features 102b, the assist transparent hole features 104, 106 are alternatively located. Each of the assist transparent hole features 104, 106 is adjacently surrounded by the lightly transparent material.

The assist transparent hole features 104, 106 further comprises a first group of transparent hole features 104 shifting the exposure light by about 90° in phase and a second group of transparent hole features 106 shifting the exposure light by about 270° in phase. The first and the second groups of transparent hole features 104, 106 are alternatively arranged with each other.

Referring to FIG. 2, in another version of the present invention, the "multiphase" phase shifting mask comprises a first group of transparent hole features 104 shifting an exposure light by about 90° in phase, a second group of transparent hole features 106 shifting the exposure light by about 270° in phase, at least one transparent hole feature 102b shifting the exposure light by about 0° in phase, and a lightly transparent material 108 shifting the exposure light by about 180° in phase. The first and the second groups of transparent hole features 104, 106 are alternatively arranged with each other, and they space apart but substantially surround the transparent hole feature 102b shifting the exposure light by abut 0° in phase.

Figure 3A:
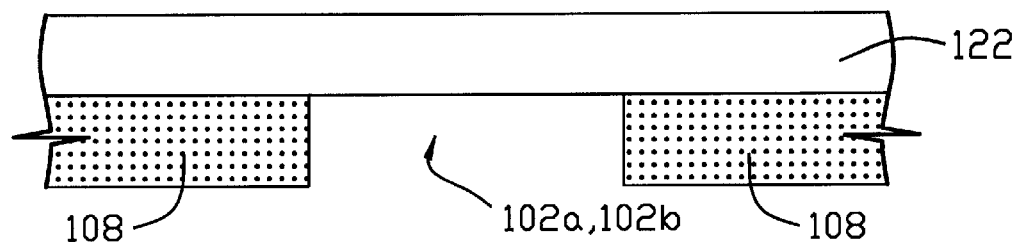
FIG. 3A is a cross sectional view taken along section line III—III of FIG. 1 or FIG. 2.

FIG. 3A is a cross sectional view taken along section line III—III of FIG. 1 or FIG. 2. Referring to FIG. 3A, in a preferred embodiment of the present invention, the multiphase phase shifting mask further comprises a transparent substrate 122 positioned over the material 108, the first transparent hole features 102a, the second transparent hole features 102b, and the assist transparent hole features 104, 106 (FIG. 2A). The transparent substrate 122 is made, for example, of quartz.

Turning to FIG. 2 and FIG. 1, the lightly transparent material 108, for example, MoSiOxNy, MoSi, or both, or any other half tone phase shifting material, adjacently surrounds each of the hole features described in the previous paragraph. The lightly transparent material 108 has a preferable transmittance of about 6%. In a preferred embodiment, the lightly transparent material 108 and the hole features 102a, 102b, 104, 106 surrounded by the lightly transparent material 108 are covered by the above-mentioned transparent substrate 122 (FIG. 3A).

Figure 3B:
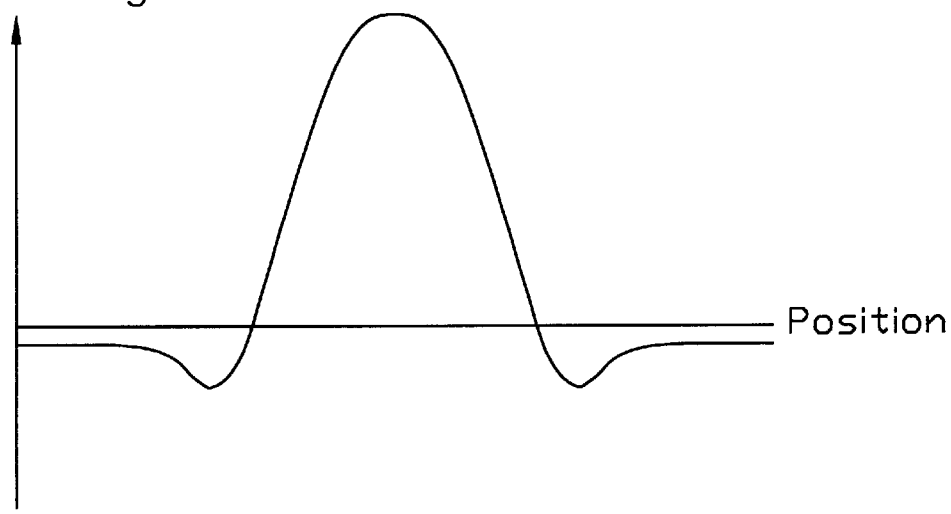
FIG. 3B depicts an E-field strength plot of light through the mask according to the present invention.
Figure 3C:
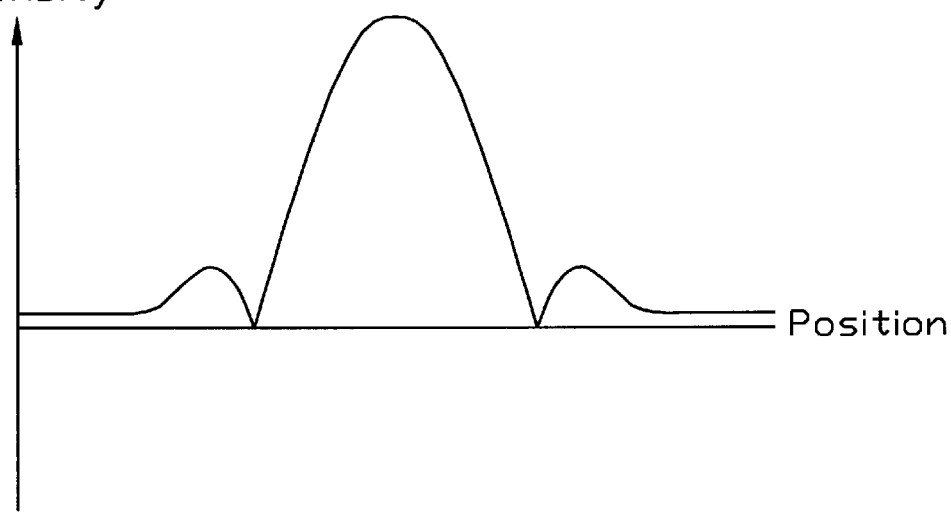
FIG. 3C depicts an intensity plot of a light on a wafer through the mask according to the present invention.

FIG. 3B depicts an E-field strength plot of light through the mask according to the present invention. FIG. 3C depicts an intensity plot of a light on a wafer through the mask according to the present invention. As shown in FIG. 3B and FIG. 3C, this mask can cause node points (zero intensity), thereby increasing the image contrast to prevent the isolated/dense proximity issues caused by environment phase differences.

Figure 4A:
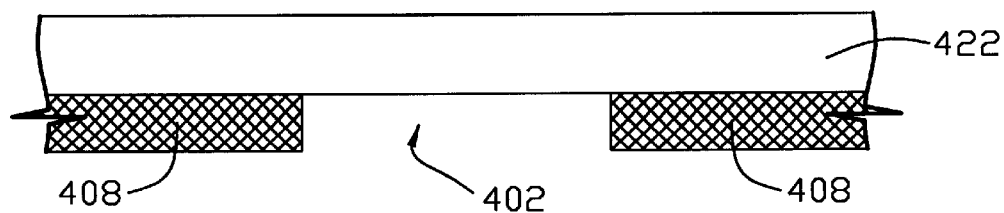
FIG. 4A is a cross sectional view schematically showing another phase shifting mask having an opaque background.
Figure 4B:
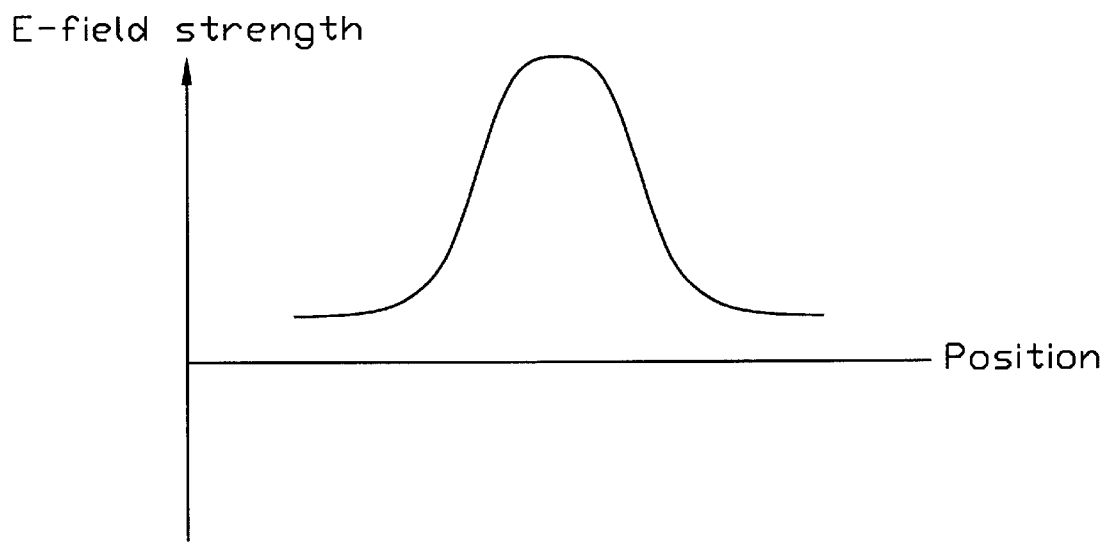
FIG. 4B depicts an E-field strength plot of light through the mask according to FIG. 4A.
Figure 4C:
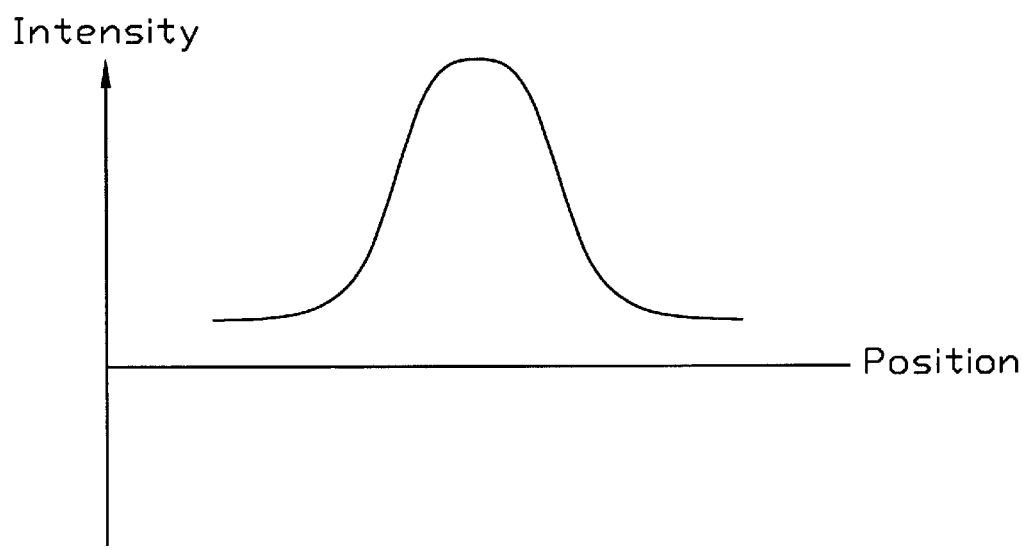
FIG. 4C depicts an intensity plot on a wafer through the mask according to FIG. 4A.

If the lightly transparent material 108 (FIG. 3A) is changed to an opaque material, the cross sectional view of the mask will be shown as FIG. 4A. Other elements such as the hole feature 402 and the substrate 422 are substantially the same as the hole feature 102a or 102b and the substrate 122 of FIG. 3A, respectively. For comparison, an E-field strength plot of light through the mask according to FIG. 4A is depicted in FIG. 4B, while an intensity plot on a wafer through the mask according to FIG. 4A is depicted in FIG. 4C. As shown in FIG. 4B, and FIG. 4C, such a mask cannot cause node points (zero intensity), thereby worsening the image contrast.

The previously described embodiments of the present invention have at least the following advantages:

1. By the lightly transparent material shifting an exposure light by about 180° in phase, the present invention can increase the image contrast to prevent the isolated/dense proximity issues caused by environment phase differences.
2. By the assist hole features shifting the exposure light by about 270° or 90° in phase, the present invention can improve the resolution of hole patterns with low duty ratio.

Although specific embodiments have been illustrated and described, it will be obvious to those skilled in the art that various modifications may be made without departing from the spirit which is intended to be limited solely by the appended claims.

What is claimed is:

1. A phase shifting mask, comprising:
   a transparent substrate;
   a transparent material shifting an exposure light by 180° in phase on the transparent substrate;
   a plurality of first transparent features shifting the exposure light by about 0° in phase on the transparent substrate;
   a plurality of second transparent features shifting the exposure light by about 0° in phase on the transparent substrate; and
   a plurality of assist transparent features alternatively located between the second transparent features on the transparent substrate, wherein the assist transparent features further comprises a first group of transparent features shifting the exposure light by about 90° in phase and a second group of transparent features shifting the exposure light by about 270° in phase alternatively arranged with each other;
   wherein each of the first, the second, and the assist transparent features is adjacently surrounded by the transparent material.

2. The phase shifting mask of claim 1, wherein the transparent substrate is made of quartz.

3. The phase shifting mask of claim 1, wherein the transparent material is MoSiOxNy.

4. The phase shifting mask of claim 1, wherein the transparent material is MoSi.

5. The phase shifting mask of claim 1, wherein the transparent material has a transmittance of about 6%.

6. A multiphase phase shifting mask, comprising:
   a transparent substrate;
   a material shifting an exposure light about 180° in phase and having a transmittance of about 6% on the transparent substrate that can increase the image contrast;
   a plurality of first transparent hole features shifting the exposure light by about 0° in phase, each first transparent hole feature is adjacently surrounded by the material on the transparent substrate;
   a plurality of second transparent hole features shifting the exposure light by about 0° in phase, each second transparent hole feature is adjacently surrounded by the material on the transparent substrate; and
   a plurality of assist transparent hole features alternatively located between the second transparent hole features, each assist transparent hole feature is adjacently surrounded by the material on the transparent substrate, wherein the assist transparent hole features further comprises:
   a first group of transparent hole features shifting the exposure light by about 90° and a second group of transparent hole features shifting the exposure light by about 270° in phase alternatively arranged with each other.

7. The multiphase phase shifting mask of claim 6, wherein the transparent substrate is made of quartz.

8. The multiphase phase shifting mask of claim 6, wherein the material shifting the exposure light by about 180° in phase is MoSiOxNy.

9. The multiphase phase shifting mask of claim 6, wherein the material shifting the exposure light by about 180° in phase is MoSi.

10. A multiphase phase shifting mask, comprising:
    a transparent material shifting an exposure light by about 180° in phase and having a transmittance of about 6% on the transparent substrate that can increase the image contrast;

a first group of transparent hole features shifting the exposure light by about 90° in phase;

a second group of transparent hole features shifting the exposure light by about 270° in phase, wherein the first and the second groups of transparent hole features are alternatively arranged with each other; and at least one transparent hole feature shifting the exposure light by about 0° in phase spaced apart from but substantially surrounded by the first and the second groups of transparent hole features;

wherein each of the hole features shifting the exposure light by about 90° in phase, the hole features shifting the exposure light by about 270° in phase, and the hole feature shifting the exposure light by about 0° in phase is adjacently surrounded by the transparent material shifting the exposure light by about 180° in phase.

11. The multiphase shifting mask of claim 10, further comprising a transparent substrate positioned over the transparent material, the transparent hole features shifting the exposure light by about 90° in phase, the transparent hole features shifting the exposure light by about 270° in phase, and the transparent hole feature shifting the exposure light by about 0° in phase.

12. The multiphase phase shifting mask of claim 10, wherein the transparent substrate is made of quartz.

13. The multiphase phase shifting mask of claim 10, wherein the transparent material is MoSiOxNy.

14. The multiphase phase shifting mask of claim 10, wherein the transparent material is MoSi.

* * * * *